United States Patent
Kim

(10) Patent No.: US 8,854,917 B2
(45) Date of Patent: Oct. 7, 2014

(54) COLUMN ADDRESS COUNTER CIRCUIT OF SEMICONDUCTOR MEMORY DEVICE

(75) Inventor: Jee Yul Kim, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 383 days.

(21) Appl. No.: 13/332,021

(22) Filed: Dec. 20, 2011

(65) Prior Publication Data

US 2012/0170398 A1  Jul. 5, 2012

(30) Foreign Application Priority Data

Dec. 30, 2010  (KR) ........................ 10-2010-0139180

(51) Int. Cl.
*G11C 8/00* (2006.01)
*G11C 8/10* (2006.01)
*G11C 7/10* (2006.01)

(52) U.S. Cl.
CPC ............... *G11C 8/10* (2013.01); *G11C 7/1018* (2013.01)
USPC ....................................... 365/236; 365/233.1

(58) Field of Classification Search
CPC ........... G11C 7/1018; G11C 8/10; G11C 8/04
USPC .................................. 365/230.06, 233.1, 236
See application file for complete search history.

(56) References Cited

U.S. PATENT DOCUMENTS

| | | | |
|---|---|---|---|
| 5,850,368 A | * | 12/1998 | Ong et al. .................. 365/238.5 |
| 2002/0196700 A1 | * | 12/2002 | Ryan et al. ................. 365/238.5 |
| 2008/0080286 A1 | * | 4/2008 | Tomita ........................ 365/222 |
| 2009/0262595 A1 | * | 10/2009 | Kuenemund et al. .... 365/230.06 |

FOREIGN PATENT DOCUMENTS

KR   1020070002821   1/2007

OTHER PUBLICATIONS

Notice of Allowance issued by the Korean Intellectual Property Office on Dec. 26, 2012.

* cited by examiner

*Primary Examiner* — Vanthu Nguyen
*Assistant Examiner* — Khamdan Alrobaie
(74) *Attorney, Agent, or Firm* — IP & T Group LLP

(57) ABSTRACT

The column address counter circuit of a semiconductor memory device includes at least one lower bit counter unit configured to generate a first bit of a column address by counting an internal clock, where the first bit is not a most significant bit of the column address, and a most significant counter unit configured to generate the most significant bit of the column address in response to a mask clock, where the mask clock is toggled when the internal clock is toggled by a set number of times.

20 Claims, 10 Drawing Sheets

110

130

140

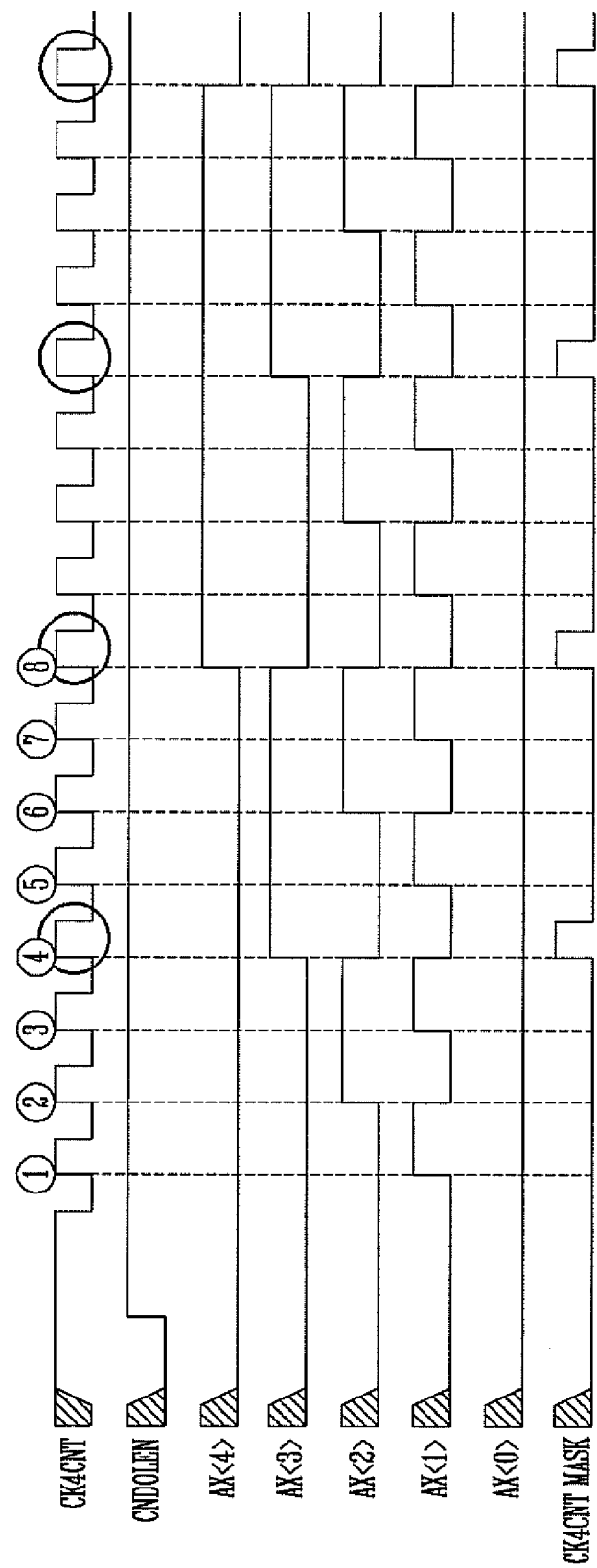

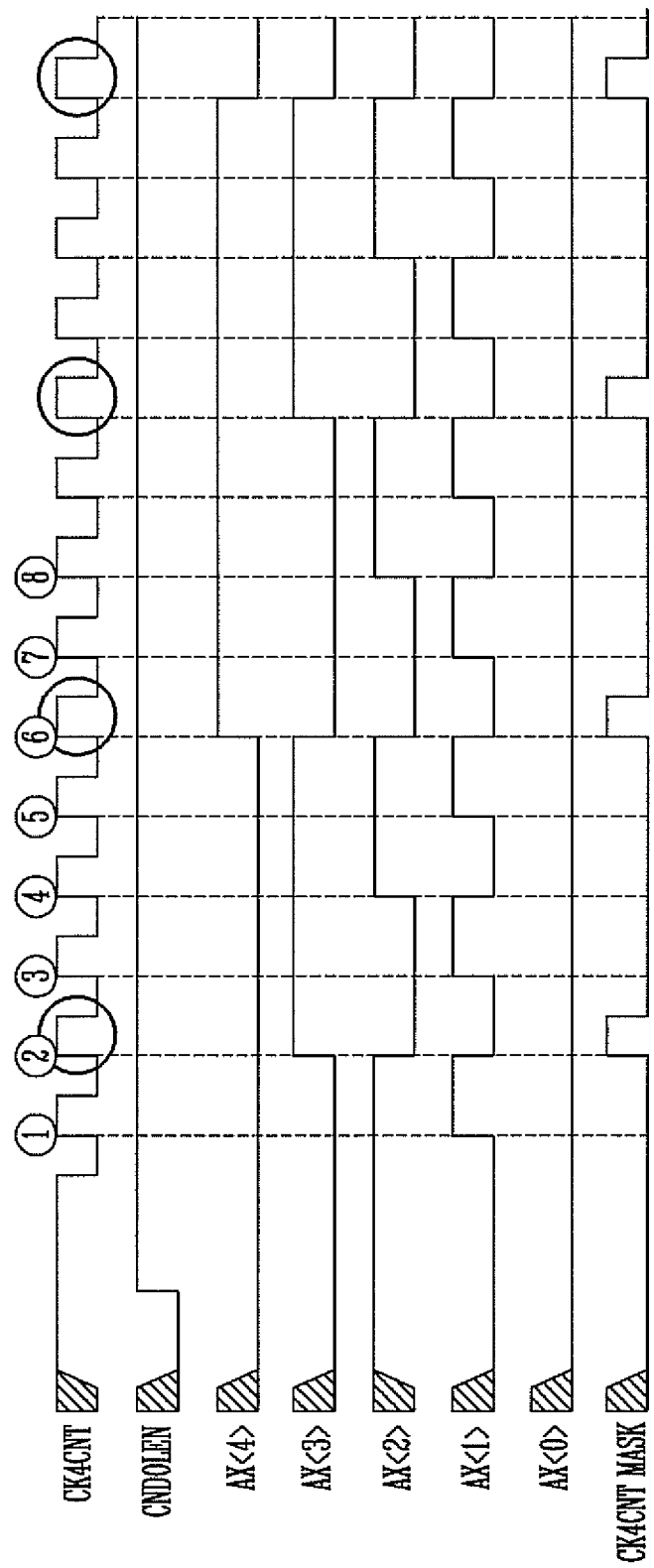

COLUMN ADDRESS COUNTER CIRCUIT OF SEMICONDUCTOR MEMORY DEVICE

CROSS-REFERENCE TO RELATED APPLICATION

Priority to Korean patent application number 10-2010-0139180 filed on Dec. 30, 2010, the entire disclosure of which is incorporated by reference herein, is claimed.

BACKGROUND

Exemplary embodiments relate to the column address counter circuit of a semiconductor memory device and, more particularly, to the column address counter circuit of a semiconductor memory device for a high-speed operation.

There is an increasing demand for nonvolatile memory devices which can be electrically programmed and erased and which do not require a refresh function of rewriting data at specific intervals.

The nonvolatile memory device receives an address, a command signal, and data at the same time when it receives external data. This operation is based on a characteristic of the nonvolatile memory device, where it sequentially receives or outputs data.

Accordingly, the nonvolatile memory device increases only a start column address whenever an internal clock CK4CNT is toggled.

FIG. 1 is a waveform illustrating data I/O timings of a known semiconductor memory device.

Referring to FIG. 1, in the semiconductor memory device, in a data I/O operation, I/O data is inputted and outputted in synchronization with the rising and falling edges of a data strobe signal DQS which is generated using a clock CLK. That is, whenever the I/O data is inputted or outputted, it is inputted/outputted as a pair at the rising edge and the falling edge of the data strobe signal DQS.

In order to increase the operating speed, in the data I/O operation of the nonvolatile memory device, the clock is internally divided into a rising clock and a falling clock, and data inputted/outputted at the rising edge of the clock are inputted/outputted through data lines that are different from data lines used for inputting/outputting data at the falling edge of the clock.

Furthermore, data inputted and outputted at a rising edge and a falling edge is defined as a pair, and thus a column address always consists of even and odd addresses, such as 0/1, 2/3, 4/5, etc. According to an example, the even column address is allocated to data synchronized with the rising edge, and the odd column address is allocated to data synchronized with the falling edge.

Accordingly, a column address counter does not count all addresses at the rising and falling edges and performs the address count operation, for example, only at the rising edge and then internally allocates even and odd column addresses to data synchronized with the rising edge and the falling edge. Here, the address count operation is performed for only half of the inputted and outputted data, a proper margin for the speed of counting can be secured.

FIGS. 2A and 2B show waveforms of signals illustrating a column address count operation in a known data I/O operation.

Referring to FIG. 2A, in the case where the cycle of a count clock CK4CNT is long, when a count operation is performed based on initial start addresses with a current column address being '0' and a next column address being '2', a column counter performs the count operation at the falling edge (1-1) of the count clock CK4CNT and outputs a current column address. Furthermore, at an edge (2-1), the column counter outputs a next column address as a counted column address.

The column counter directly outputs a column address without a count operation up to a second column address because it has previously counted a current column address and a next column address before the count operation is started. Thereafter, the column counter counts the falling edge of the count clock CK4CNT at edge (3-1) and outputs a column address. In the case where the cycle of the count clock CK4CNT is long, the count operation of the column address can sufficiently secure an adequate margin for the count operation.

Referring to FIG. 2B, in the case where the cycle of the count clock CK4CNT is short, the column counter performs a count operation at the falling edge (1-2) of the count clock CK4CNT and outputs a current column address. At edge (2-2), the column counter outputs a next column address as a counted column address. However, at edge (3-2) where a column address counted by the count operation is outputted, a point of time at which the count operation is finished passes the falling edge of the count clock CK4CNT because the cycle of the count clock CK4CNT is short. In this case, the column address is not properly counted.

BRIEF SUMMARY

Exemplary embodiments relate to the column address counter circuit of a semiconductor memory device which is capable of securing the margin of a count operation.

A column address counter circuit of a semiconductor memory device according to an aspect of the present disclosure includes at least one lower bit counter unit configured to generate a first bit of a column address by counting an internal clock, wherein the first bit is not a most significant bit of the column address, and a most significant counter unit configured to generate the most significant bit of the column address in response to a mask clock, wherein the mask clock is toggled when the internal clock is toggled by a set number of times.

A column address counter circuit of a semiconductor memory device according to another aspect of the present disclosure includes a clock mask unit configured to generate a mask clock, wherein the mask clock is toggled when an internal clock is toggled by a set number of times and a column address counter unit configured to generate the column addresses increased from an initial column address by counting the internal clock. Here, the most significant bit of the column addresses is increased in response to the mask clock.

A column address counter circuit of a semiconductor memory device according to yet another aspect of the present disclosure includes a clock state unit configured to set a next mask and next state in response to current state and a plurality of decoded address signals, a clock mask unit configured to generate a current mask and the current state by synchronizing the next mask and the next state with an inverted clock of an internal clock, a mask clock output unit configured to generate a mask clock in response to the current mask and the internal clock, and a column address counter unit configured to generate a column address, wherein the column address is increased from an initial column address by counting the internal clock and a most significant bit of the column address is increased in response to the mask clock.

BRIEF DESCRIPTION OF THE DRAWINGS

FIGS. 8A to 8D show waveforms of signals illustrating the operation of the column address counter circuit according to an exemplary embodiment of this disclosure.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
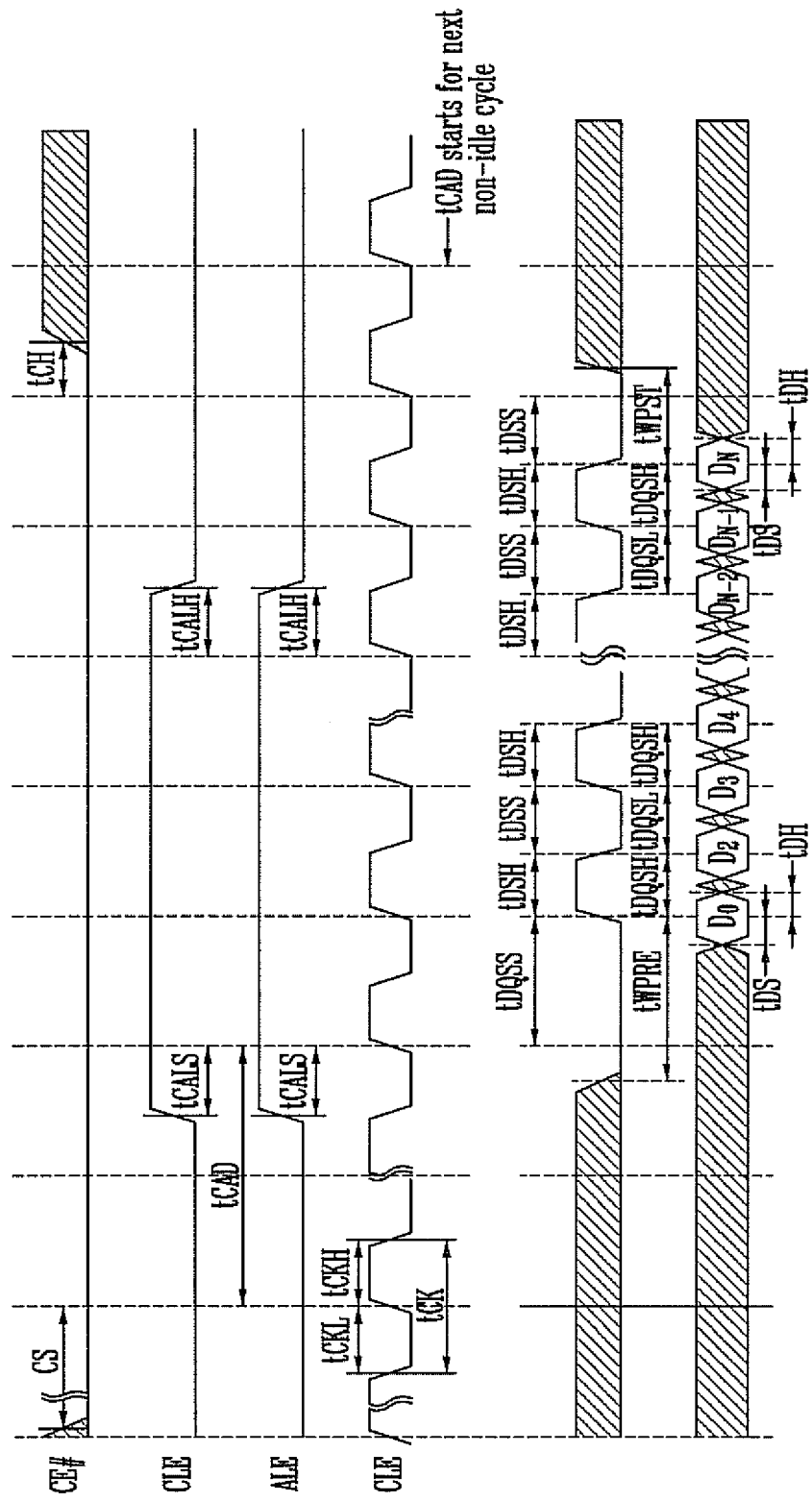
FIG. 1 is a waveform illustrating data I/O edges of a known semiconductor memory device.
Figure 2A:
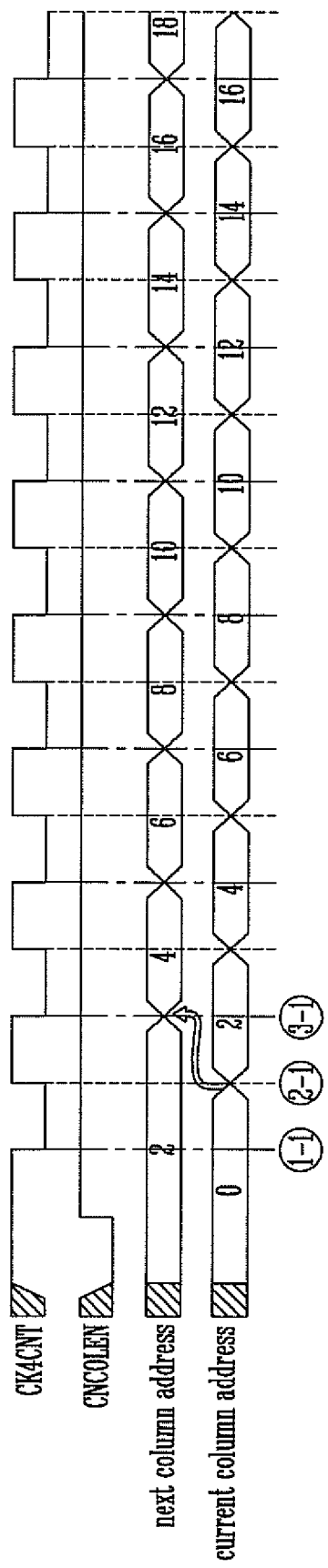
FIGS. 2A and 2B show waveforms of signals illustrating a column address count operation in a known data I/O operation.
Figure 2B:
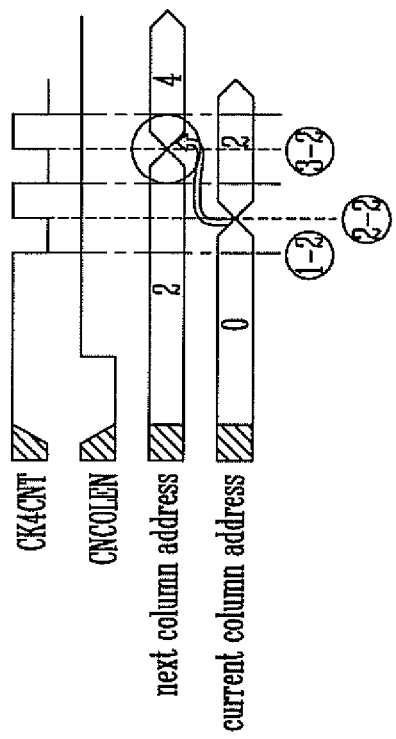
Figure 3:
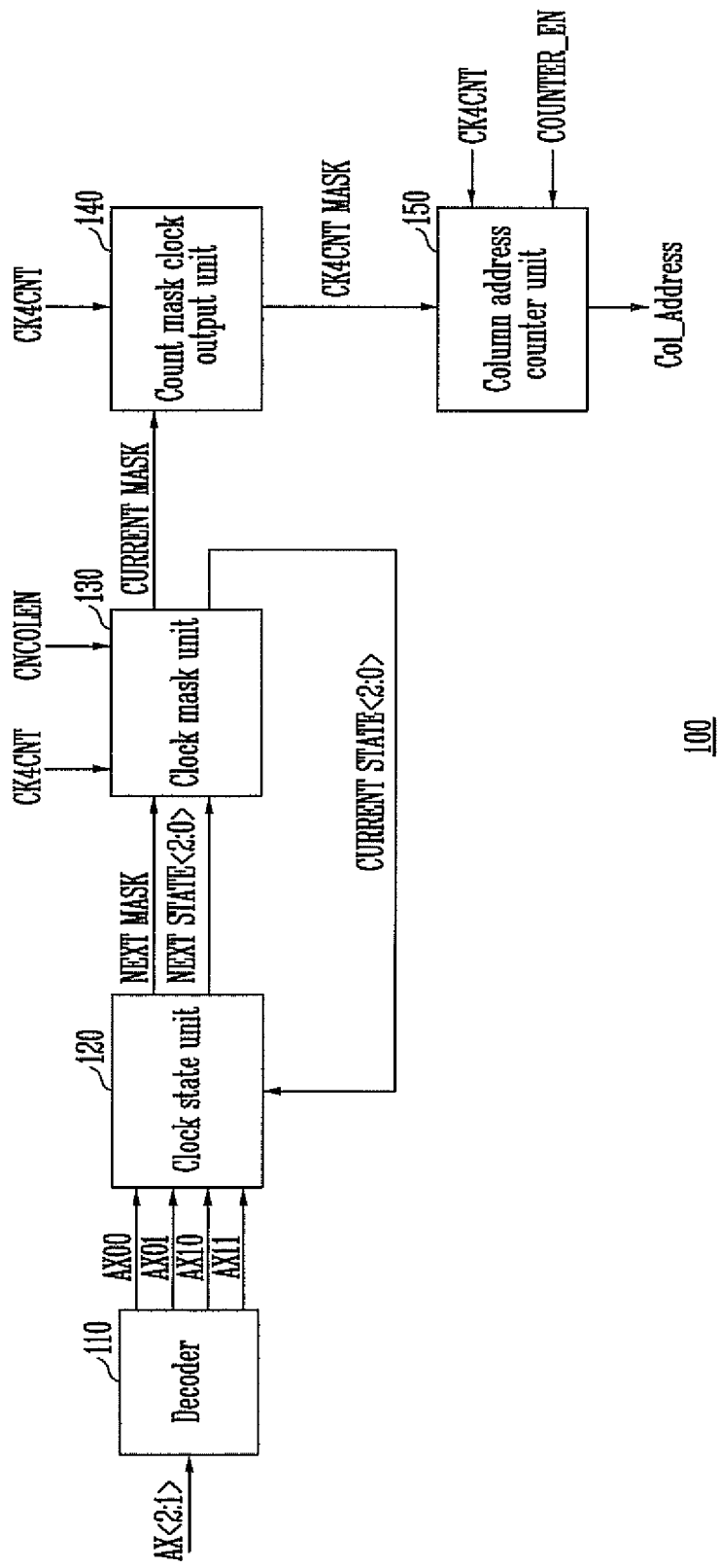
FIG. 3 is a block diagram of the column address counter circuit of a semiconductor memory device according to an exemplary embodiment of this disclosure.

FIG. 3 is a block diagram of the column address counter circuit of a semiconductor memory device according to an exemplary embodiment of this disclosure.

Referring to FIG. 3, the column address counter circuit 100 of a semiconductor memory device includes a decoder 110, a clock state unit 120, a clock mask unit 130, a mask count clock output unit 140, and a column address counter unit 150.

The decoder 110 outputs a current address in the form of address decoding signals AX00 to AX11 of a flag form in response to the address signals AX<2:1> of externally inputted address signals AX<12:0>.

The clock state unit 120 generates a next mask signal NEXT MASK indicating which clock is to be outputted as a mask clock signal in response to the address decoding signals AX00 to AX11. That is, the clock state unit 120 generates the next mask NEXT MASK and next state NEXT STATE<2:0> in response to the address decoding signals AX00 to AX11 and the current state CURRENT STATE<2:0> received from the clock mask unit 130.

The clock mask unit 130 receives the next mask NEXT MASK from the clock state unit 120 and sequentially performs current states, where the clock mask unit 130 sequentially aligns the next mask NEXT MASK as a current mask CURRENT MASK.

The count mask clock output unit 140 generates a count mask clock CK4CNT MASK in response to the current mask CURRENT MASK and a count clock CK4CNT.

The column address counter unit 150 generates increased column addresses Col_Address<3:0> of start column addresses by counting the count clock CK4CNT, where it increases the column address Col_Address<3> (that is, the most significant bit) according to the mask count clock CK4CNT MASK.

As described above, the column address counter circuit 100 generates the current mask CURRENT MASK, indicating which one of the toggled count clocks CK4CNT will be replaced with the mask count clock CK4CNT MASK in response to the address signals AX<2:1> of the externally inputted address signals AX<12:0> and generates the column address Col_Address by counting an initial column address using the count clock CK4CNT. Here, the column address counter circuit 100 performs a count operation using the mask count clock CK4CNT MASK generated using the current mask CURRENT MASK at a set clock. Accordingly, an adequate margin for the count operation can be secured.

Figure 4:
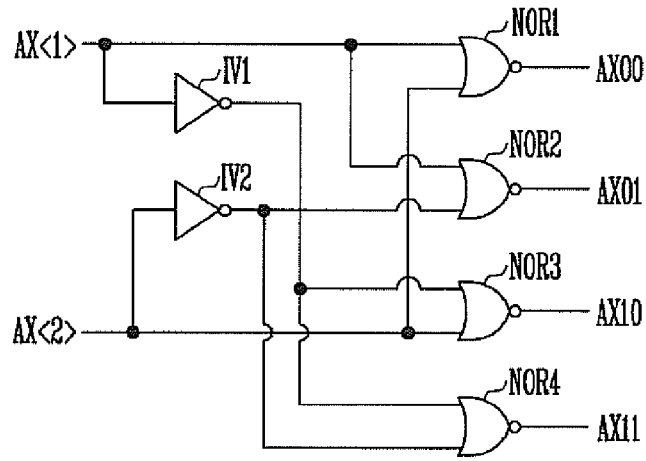
FIG. 4 is a detailed circuit diagram of a decoder shown in FIG. 3.

FIG. 4 is a detailed circuit diagram of the decoder 110 shown in FIG. 3.

Referring to FIG. 3, the decoder 110 generates the address decoding signals AX00, AX01, AX10, and AX11 in response to the address signals AX<2:1> of the address signals AX<12:0>.

The decoder 110 includes a plurality of inverters IV1 and IV2 and a plurality of NOR gates NOR1 to NOR4. The inverter IV1 and the inverter IV2 invert the address signal AX<1> and the address signal AX<2>, respectively, and output inverted signals. The NOR gate NOR1 generates the address decoding signal AX00 in response to the address signal AX<1> and the address signal AX<2>. The NOR gate NOR2 generates the address decoding signal AX01 in response to the address signal AX<1> and an output signal of the inverter IV2. The NOR gate NOR3 generates the address decoding signal AX10 in response to the address signal AX<2> and an output signal of the inverter IV1. The NOR gate NOR4 generates the address decoding signal AX11 in response to output signals of the inverter IV1 and the inverter IV2.

Figure 5:
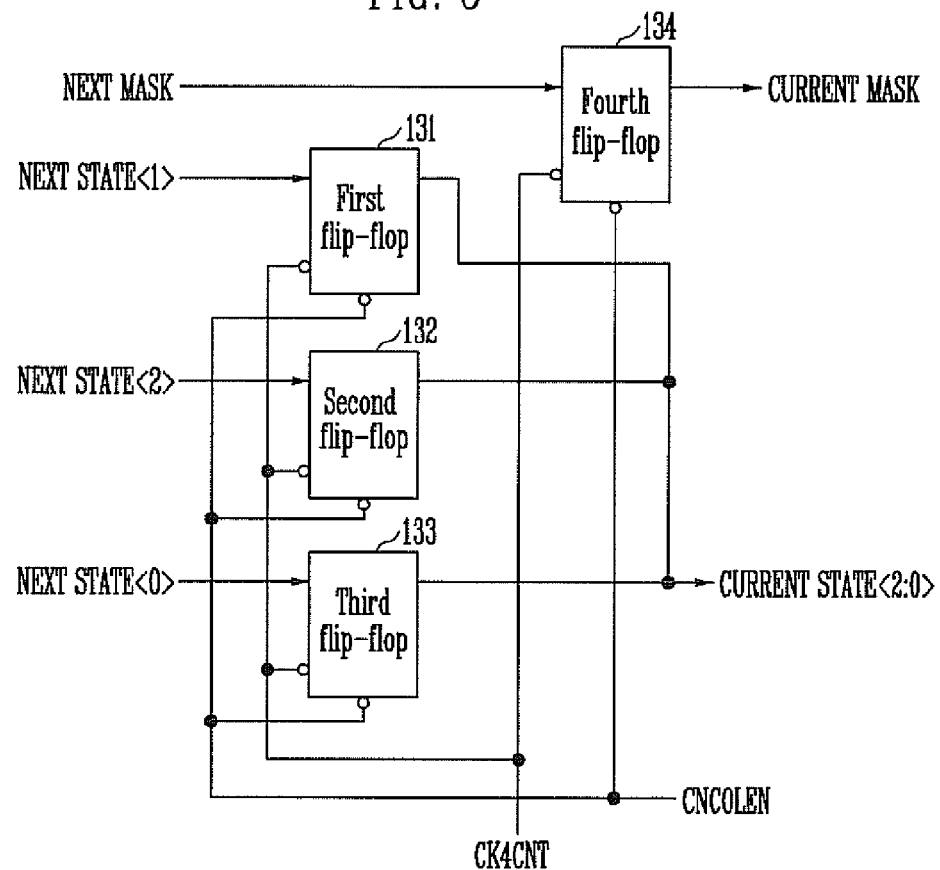
FIG. 5 is a detailed circuit diagram of a clock mask unit shown in FIG. 3.

FIG. 5 is a detailed circuit diagram of the clock mask unit 130 shown in FIG. 3.

The clock mask unit 130 generates the current mask CURRENT MASK by synchronizing the next mask NEXT MASK of the clock state unit 120 with the count clock CK4CNT and generates the current state CURRENT STATE<2:0> by synchronizing the respective next state NEXT STATE<2:0> with an inverted clock of the count clock CK4CNT.

The clock mask unit 130 includes first to fourth flip-flops 131 to 134. The first flip-flop 131 is activated in response to a column counter enable signal CNCOLEN activated in the section in which the column counter circuit is operated and configured to generate the current state CURRENT STATE<1> by synchronizing the next state NEXT STATE<1> with an inverted clock of the count clock CK4CNT. The second flip-flop 132 is activated in response to the column counter enable signal CNCOLEN and configured to generate the current state CURRENT STATE<2> by synchronizing the next state NEXT STATE<2> with an inverted clock of the count clock CK4CNT. The third flip-flop 133 is activated in response to the column counter enable signal CNCOLEN and configured to generate the current state CURRENT STATE<0> by synchronizing the next state NEXT STATE<0> with an inverted clock of the count clock CK4CNT. The fourth flip-flop 134 is activated in response to the column counter enable signal CNCOLEN and configured to generate the current mask CURRENT MASK by synchronizing the next mask NEXT MASK with an inverted clock of the count clock CK4CNT.

Figure 6:
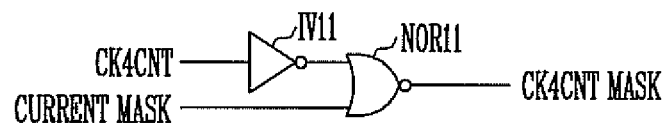
FIG. 6 is a detailed circuit diagram of a mask count clock output unit shown in FIG. 3.

FIG. 6 is a detailed circuit diagram of the mask count clock output unit 140 shown in FIG. 3.

The mask count clock output unit 140 generates the mask count clock CK4CNT MASK in response to the count clock CK4CNT and the current mask CURRENT MASK received from the clock mask unit 130.

The mask count clock output unit 140 includes an inverter IV11 and a NOR gate NOR11. The inverter IV11 inverts the count clock CK4CNT and outputs the inverted clock. The NOR gate NOR11 generates the mask count clock CK4CNT MASK by logically combining the current mask CURRENT MASK and the output signal of the inverter IV11.

Figure 7:
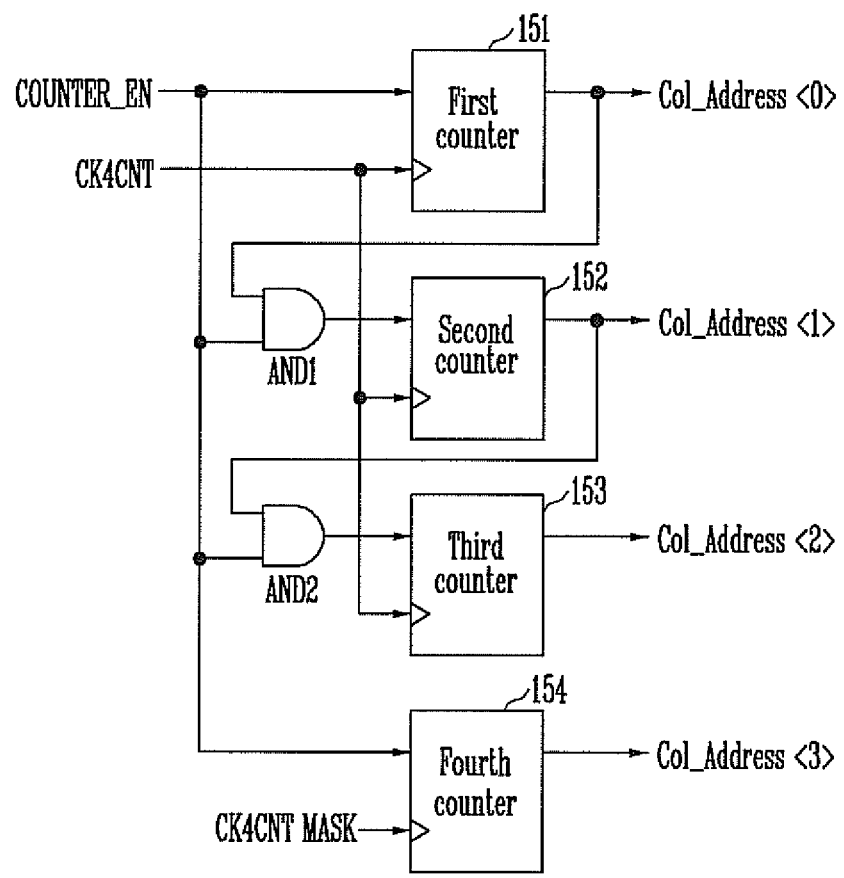
FIG. 7 is a detailed circuit diagram of a column address counter unit shown in FIG. 3.

FIG. 7 is a detailed circuit diagram of the column address counter unit 150 shown in FIG. 3.

The column address counter unit 150 generates the column addresses Col Address<3:0> by counting the count clock CK4CNT and the mask count clock CK4CNT MASK.

The column address counter unit 150 includes AND gates AND1 and AND2 and first to fourth counters 151 to 154. The first counter 151 is activated in response to the counter enable signal COUNTER_EN and configured to generate the column address Col_Address<0> by counting the count clock CK4CNT. The AND gate AND1 generates an output signal by logically combining the counter enable signal COUNTER_EN and the column address Col_Address<0> of the first counter 151 and outputs the output signal to the second counter 152. The second counter 152 is activated in response to the output signal of the AND gate AND1 and configured to generate the column address Col_Address<1> by counting the count clock CK4CNT. The AND gate AND2 generates an output signal by logically combining the counter enable signal COUNTER_EN and the column address Col_Address<1> of the second counter 152 and outputs the output signal to the third counter 153. The third counter 153 is activated in response to the output signal of the AND gate AND2 and configured to generate the column address Col_Address<2> by counting the count clock CK4CNT. The fourth counter 154 is activated in response to the counter enable signal COUNTER_EN and configured to generate the column address Col_Address<3> by counting the mask count clock CK4CNT MASK. The column address Col_Address<3> of the above column addresses is the most significant bit.

Here, the first to third counter 151 to 153 of the column address counter unit 150 generate the column addresses Col_Address<2:0> by sequentially counting the count clocks CK4CNT. The fourth counter 154 generates the column address Col_Address<3> (that is, the most significant bit) by counting the mask count clock CK4CNT MASK.

In the exemplary embodiment of this disclosure, while the column address counter unit is illustrated to be implemented by coupling the plurality of counters in series, the column address counter unit may also be implemented by coupling the plurality of counters in parallel.

FIGS. 8A to 8D show waveforms of signals illustrating the operation of the column address counter circuit according to an exemplary embodiment of this disclosure.

Figure 8B:
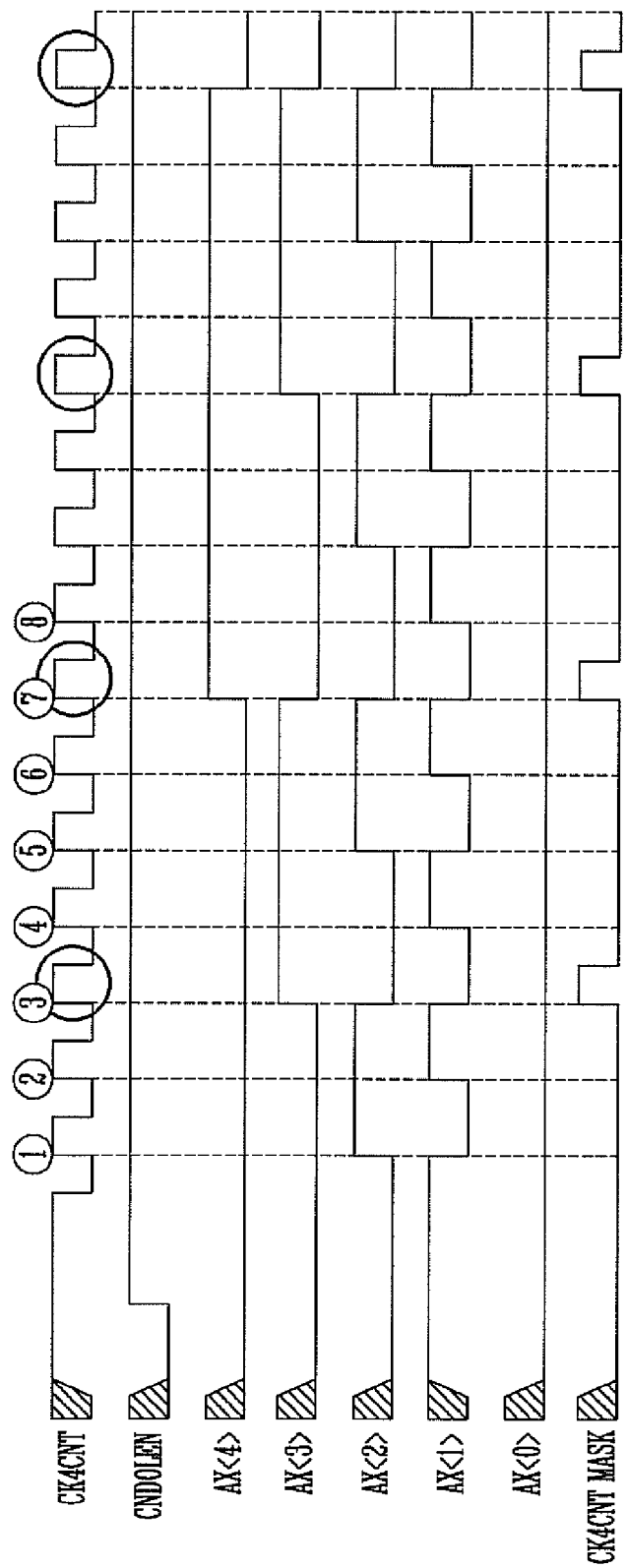
Figure 8D:
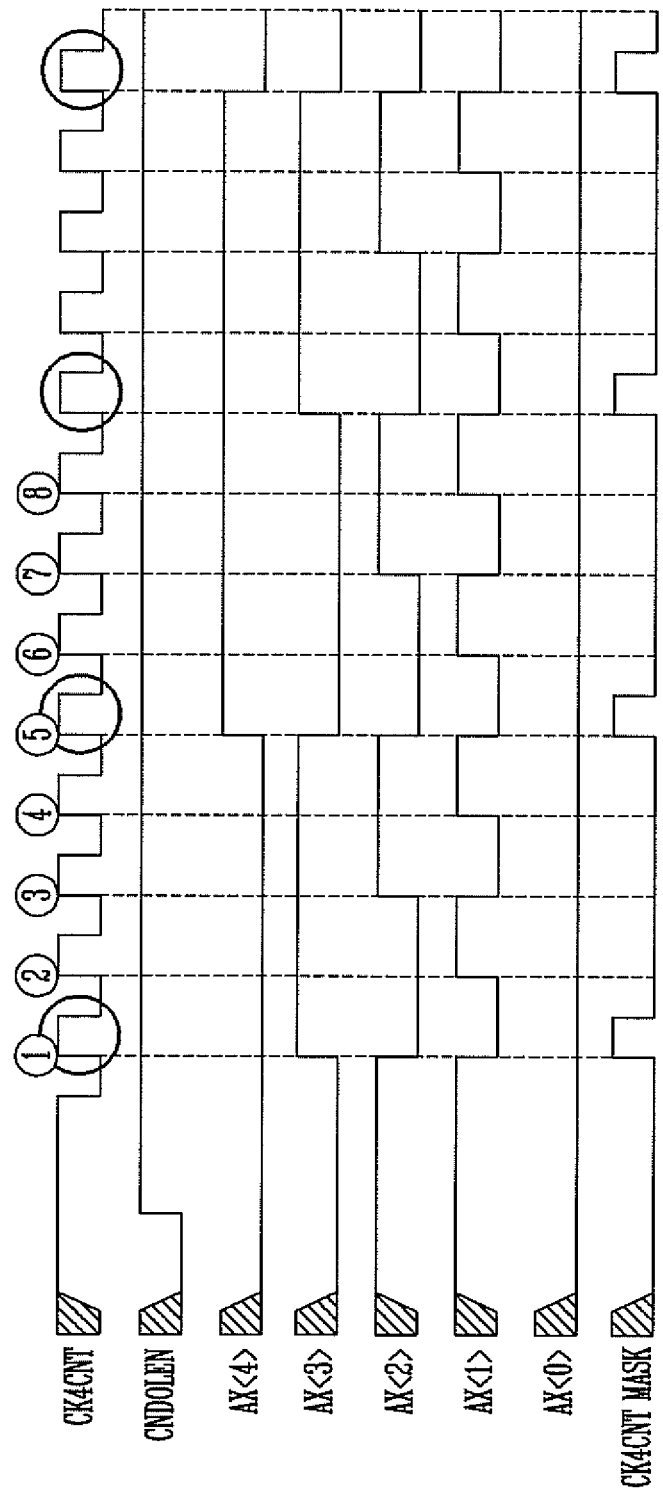

FIG. 8A shows the waveforms of the signals when the address signals AX<2:1> are '00'. FIG. 8B shows the waveforms of the signals when the address signals AX<2:1> are '01'. FIG. 8C shows the waveforms of the signals when the address signals AX<2:1> are '10'. FIG. 8D shows the waveforms of the signals when the address signals AX<2:1> are '11'.

Figure 9:
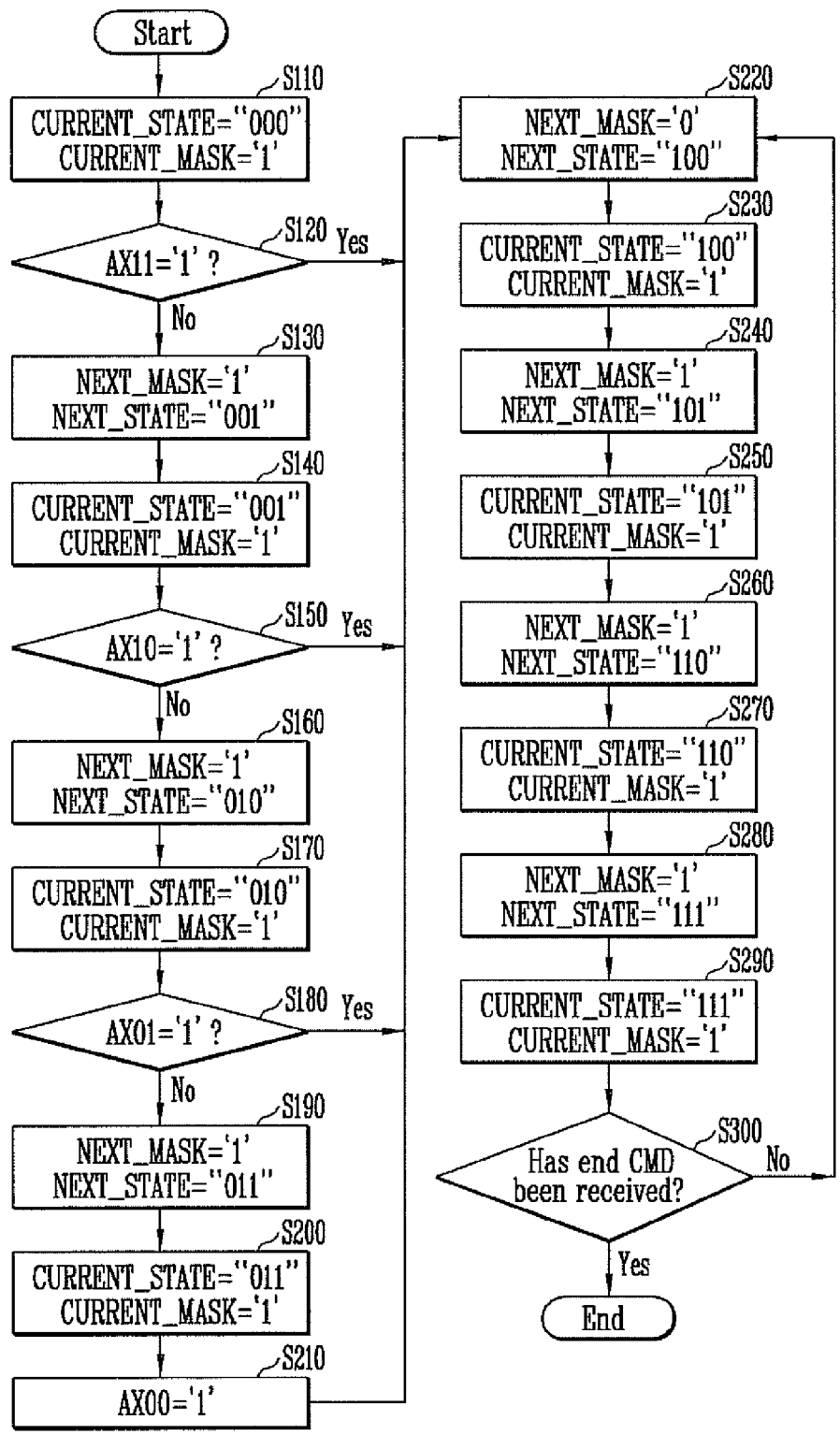
FIG. 9 is a flowchart illustrating the operation of a clock state unit shown in FIG. 3.

FIG. 9 is a flowchart illustrating the operation of the clock state unit 120 shown in FIG. 3.

The operation of the column address counter circuit of a semiconductor memory device according to an exemplary embodiment of this disclosure is described below with reference to FIGS. 3 to 9.

When the address signals AX<2:1> are '00', the address decoding signal AX00 of the decoder 110 is outputted at a high level, and the remaining address decoding signals AX01, AX10, and AX11 are outputted in a low level.

Referring to FIG. 8A, when the address signals AX<2:1> are '00', the first, second, and third clocks of the column count clocks have to be masked, and the fourth clock thereof have to be excluded.

The clock state unit 120 performs the next mask NEXT MASK and the next state NEXT STATE in response to states of the address decoding signals AX00 to AX11 of the decoder 110. The clock mask unit 130 controls to increase and update the current mask CURRENT MASK and the current state CURRENT STATE at the falling edge of the count clock CK4CNT. Thereafter, the clock state unit 120 repeats the above operation by determining the states of the address decoding signals AX00 to AX11 again.

More particularly, the clock state unit 120 sets the current state CURRENT STATE and the current mask CURRENT MASK to '000' and '1', respectively, at step S110.

Next, the clock state unit 120 determines whether a value of the address decoding signal AX11 outputted from the decoder 11 is '1' at step S120. If, as a result of the determination, the value of the address decoding signal AX11 is '0', the clock state unit 120 sets the next mask NEXT MASK and the next state NEXT STATE to '1' and '001' at step S130 and controls to set the current state CURRENT STATE to '001' at step S140.

Next, the clock state unit 120 determines whether a value of the address decoding signal AX10 outputted from the decoder 11 is '1' at step S150. If, as a result of the determination, the value of the address decoding signal AX10 is '0', the clock state unit 120 sets the next state NEXT STATE to '010' at step S160 and controls to set the current state CURRENT STATE to '010' at step S170.

Next, the clock state unit 120 determines whether a value of the address decoding signal AX01 outputted from the decoder 11 is '1' at step S180. If, as a result of the determination, the value of the address decoding signal AX01 is '0', the clock state unit 120 sets the next state NEXT STATE to '011' at step S190 and controls to set the current state CURRENT STATE to '011' at step S200.

Next, when a value of the address decoding signal AX00 outputted from the decoder 110 is '0' at step S210, the clock state unit 120 sets the next mask NEXT MASK and the next state NEXT STATE to '0' and '100', respective, at step S220. Next, the clock state unit 120 controls to set values of the current state CURRENT STATE and the next state NEXT STATE by sequentially increasing the values.

That is, when the address signals AX<2:1> are '00', the address decoding signal AX11 is not '1', and thus the next mask NEXT MASK remains '1' and the next state NEXT STATE remains '001'. In the meantime, at the falling edge of the first count clock CK4CNT, the current state CURRENT STATE becomes '001' and the current mask CURRENT MASK becomes '1'. Furthermore, since the address decoding signals AX10 and AX01 are not '1', the current state CURRENT STATE becomes '011' and the current mask CURRENT MASK becomes '1' after a lapse of two falling edges of the two count clocks CK4CNT. Furthermore, since the address decoding signal AX00 is '1', the next mask NEXT MASK becomes '0' and the next state NEXT STATE becomes '100'. Furthermore, at the fourth falling edge of the count clock CK4CNT, the current mask CURRENT MASK becomes '0', so that the masked count clock CK4CNT is unmasked.

The mask count clock output unit 140 generates the mask count clock CK4CNT MASK in response to the count clock CK4CNT and the current mask CURRENT MASK of the clock mask unit 130.

The first to third counters 151 to 153 of the column address counter unit 150 generate the column addresses Col_Address<2:0> by sequentially counting the count clocks CK4CNT. The fourth counter 154 generates the column address Col_Address<0> by counting the mask count clock CK4CNT MASK.

More specifically, the first to third counters 151 to 153 generate the column addresses Col_Address<2:0> by counting the first to third clocks of the count clocks CK4CNT. At a timing that the fourth clock of the count clocks CK4CNT is toggled, the fourth counter 154 generates the column address Col_Address<3> (that is, the most significant bit) by counting the mask count clock CK4CNT MASK.

Accordingly, in the count operation of the column address counter unit 150, after the third clock is counted, the count operation of a fifth clock is prepared during one clock margin. Accordingly, ¼ of the entire margin is secured.

According to the embodiments of this disclosure, the mask count clock is generated in response to some of the plurality of address signals whenever the count clock is toggled by a desired number of times. In an operation of counting the column addresses, the column addresses are outputted by counting the count clock, and the most significant bit of the column addresses is increased in response to the mask count clock whenever the count clock is toggled by a desired number of times. Accordingly, the margin of the count operation can be secured.

What is claimed is:

1. A column address counter circuit of a semiconductor memory device, comprising:
    at least one lower bit counter unit configured to generate a first bit of a column address by counting an internal clock, wherein the first bit is not a most significant bit of the column address; and
    a most significant counter unit configured to generate the most significant bit of the column address in response to a mask clock, wherein the mask clock is toggled when the internal clock is toggled by a set number of times.

2. The column address counter circuit of claim 1, wherein the at least one lower bit counter unit comprises a plurality of counter circuits configured to be activated in response to a counter enable signal and generate first bits of the column address that are not the most significant bits of the column address.

3. The column address counter circuit of claim 1, wherein the at least one lower bit counter unit comprises:
    a first counter activated in response to a counter enable signal and configured to generate an output signal by counting the internal clock;
    a first logic gate configured to logically combine the counter enable signal and the output signal of the first counter;
    a second counter configured to be activated in response to an output signal of the first logic gate and generate an output signal by counting the internal clock;
    a second logic gate configured to logically combine the counter enable signal and the output signal of the second counter; and
    a third counter configured to be activated in response to the output signal of the second logic gate and generate the column addresses by counting the internal clock.

4. A column address counter circuit of a semiconductor memory device, comprising:
    a clock mask unit configured to generate a mask clock, wherein the mask clock is toggled when an internal clock is toggled by a set number of times; and
    a column address counter unit configured to generate the column addresses increased from an initial column address by counting the internal clock, wherein a most significant bit of the column address is increased in response to the mask clock.

5. The column address counter circuit of claim 4, wherein the clock mask unit is configured to generate the mask clock in response to address signals.

6. The column address counter circuit of claim 5, wherein the clock mask unit comprises:
    a decoder configured to generate a plurality of decoded address signals by decoding the address signals;
    a clock state unit configured to set a next mask and next state in response to the decoded address signals and current state and outputting the set next mask and the set next state;
    a clock mask unit configured to generate a current mask and the current state by synchronizing the next mask and next state with an inverted clock of the internal clock; and
    a mask clock output unit configured to generate the mask clock in response to the current mask and the internal clock.

7. The column address counter circuit of claim 6, wherein the decoder comprises a plurality of logic gates configured to output the decoded address signals by logically combining the address signals and inverted signals of the address signals.

8. The column address counter circuit of claim 6, wherein the clock state unit is configured to determine values of the next mask and the next state based on the decoded address signals.

9. The column address counter circuit of claim 6, wherein the clock mask unit comprises:
    a first flip-flop configured to generate a bit for the current state by synchronizing a bit for the next state with the inverted clock of the internal clock; and
    a second flip-flop configured to generate the current mask by synchronizing the next mask with the inverted clock of the internal clock.

10. The column address counter circuit of claim 6, wherein the mask clock output unit comprises a logic gate configured to generate the mask clock by logically combining the internal clock and the count mask.

11. The column address counter circuit of claim 4, wherein the column address counter unit comprises:
    a first counter unit configured to generate first bits of the column address by counting the internal clock, wherein the first bits are not the most significant bit; and
    a second counter unit configured to increase the most significant bit of the column address by counting the mask clock.

12. The column address counter circuit of claim 11, wherein the first counter unit comprises:
    a first counter configured to be activated in response to a counter enable signal and configured to generate an output signal by counting the internal clock;
    a first logic gate configured to logically combine the counter enable signal and the output signal of the first counter;
    a second counter configured to be activated in response to an output signal of the first logic gate and generate an output signal by counting the internal clock;
    a second logic gate configured to logically combine the counter enable signal and the output signal of the second counter; and
    a third counter configured to be activated in response to the output signal of the second logic gate and generate the column addresses by counting the internal clock.

13. A column address counter circuit of a semiconductor memory device, comprising:

a clock state unit configured to set a next mask and next state in response to current state and a plurality of decoded address signals;

a clock mask unit configured to generate a current mask and the current state by synchronizing the next mask and the next state with an inverted clock of an internal clock;

a mask clock output unit configured to generate a mask clock in response to the current mask and the internal clock; and a column address counter unit configured to generate a column address, wherein the column address is increased from an initial column address by counting the internal clock and a most significant bit of the column address is increased in response to the mask clock.

14. The column address counter circuit of claim 13, further comprising a decoder configured to generate the plurality of decoded address signals by decoding address signals.

15. The column address counter circuit of claim 14, wherein the decoder comprises a plurality of logic gates configured to output the decoded address signals by logically combining the address signals and inverted signals of the address signals.

16. The column address counter circuit of claim 13, wherein the clock state unit is configured to determine values of the next mask and the next state based on the plurality of decoded address signals.

17. The column address counter circuit of claim 13, wherein the clock mask unit comprises:

a first flip-flop configured to generate a bit of the current state by synchronizing a bit of the next state with the inverted clock of the internal clock; and a second flip-flop configured to generate the current mask by synchronizing the next mask with the inverted clock of the internal clock.

18. The column address counter circuit of claim 13, wherein the mask clock output unit comprises a logic gate configured to generate the mask clock by logically combining the internal clock and the count mask.

19. The column address counter circuit of claim 13, wherein the column address counter unit comprises:

a first counter unit configured to generate first bits of the column address by counting the internal clock, wherein the first bits are not the most significant bit of the column address; and a second counter unit configured to increase the most significant bit of the column address by counting the mask clock.

20. The column address counter circuit of claim 19, wherein the first counter unit comprises:

a first counter configured to be activated in response to a counter enable signal and generate an output signal by counting the internal clock;

a first logic gate configured to logically combine the counter enable signal and the output signal of the first counter;

a second counter configured to be activated in response to an output signal of the first logic gate and generate an output signal by counting the internal clock;

a second logic gate configured to logically combine the counter enable signal and the output signal of the second counter; and a third counter configured to be activated in response to the output signal of the second logic gate and generate the column address by counting the internal clock.

* * * * *